United States Patent
Liu (10) Patent No.: US 12,320,760 B2
(45) Date of Patent: Jun. 3, 2025

(54) DEVICE FOR DETECTING SAR, METHOD FOR REDUCING SAR, AND MOBILE TERMINAL

(71) Applicant: ZTE CORPORATION, Guangdong (CN)

(72) Inventor: Ruibin Liu, Guangdong (CN)

(73) Assignee: ZTE CORPORATION, Shenzhen (CN)

( * ) Notice: Subject to any disclaimer, the term of this patent is extended or adjusted under 35 U.S.C. 154(b) by 508 days.

(21) Appl. No.: 17/624,230

(22) PCT Filed: Jun. 2, 2020

(86) PCT No.: PCT/CN2020/093857
§ 371 (c)(1),
(2) Date: Dec. 30, 2021

(87) PCT Pub. No.: WO2021/008261
PCT Pub. Date: Jan. 21, 2021

(65) Prior Publication Data
US 2022/0349839 A1    Nov. 3, 2022

(30) Foreign Application Priority Data

Jul. 12, 2019  (CN) .......................... 201910630690.1

(51) Int. Cl.
*G01N 22/00* (2006.01)
*G01D 5/24* (2006.01)

(52) U.S. Cl.
CPC ............... *G01N 22/00* (2013.01); *G01D 5/24* (2013.01)

(58) Field of Classification Search
CPC ................................. G01N 22/00; G01D 5/24
See application file for complete search history.

(56) References Cited

U.S. PATENT DOCUMENTS

| 6,362,789 B1 | 3/2002 | Trumbull et al. |
| 9,490,885 B1 | 11/2016 | Zheng et al. |

(Continued)

FOREIGN PATENT DOCUMENTS

| CN | 103067038 A | 4/2013 |
| CN | 103428314 A | 12/2013 |

(Continued)

OTHER PUBLICATIONS

ZTE Corporation, Extended European Search Report, EP 20840505. 0, Jun. 30, 2022, 10 pgs.

(Continued)

*Primary Examiner* — Vladimir Magloire
*Assistant Examiner* — Maxine McKenzie Phillips
(74) *Attorney, Agent, or Firm* — Morgan, Lewis & Bockius LLP (57) ABSTRACT

The present application relates to a device and a method for detecting SAR and a mobile terminal. The device comprises: an SAR sensor, a plurality of first capacitance limitation modules, a plurality of second capacitance limitation modules, and a plurality of signal isolation modules. The SAR sensor comprises a plurality of detection ports each is configured to perform SAR detection on one antenna. The first end and second end of each first capacitance limitation module are connected to the antenna and the detection port respectively. The first end and second end of each second capacitance limitation module is connected to the detection port and a power control circuit respectively. The first end of each signal isolation module is connected to the antenna; the second end of each signal isolation module is connected to the detection port.

4 Claims, 5 Drawing Sheets

(56) References Cited

U.S. PATENT DOCUMENTS

| | | |
|---|---|---|
| 10,321,463 B1 | 6/2019 | Ramasamy et al. |
| 2012/0258772 A1 | 10/2012 | Brogle et al. |
| 2014/0087786 A1 | 3/2014 | Tani et al. |
| 2014/0155000 A1 | 6/2014 | Erkens |
| 2017/0194996 A1 | 7/2017 | Shi et al. |

FOREIGN PATENT DOCUMENTS

| | | | | |
|---|---|---|---|---|
| CN | 103443999 A | | 12/2013 | |
| CN | 104779435 A | | 7/2015 | |
| CN | 106207375 A | | 12/2016 | |
| CN | 106550067 A | | 3/2017 | |
| CN | 206098681 U | | 4/2017 | |
| CN | 107548145 A | | 1/2018 | |
| CN | 109088151 A | | 12/2018 | |
| CN | 109474740 A | | 3/2019 | |
| CN | 209170386 U | * | 7/2019 | |
| CN | 108075795 B | * | 11/2023 | ............. H04B 1/005 |
| DE | 102019100164 A1 | * | 7/2019 | ............. H01Q 1/243 |
| EP | 3176952 A1 | * | 6/2017 | ............ H04B 1/3838 |
| EP | 3367187 A1 | * | 8/2018 | ............. H01R 31/02 |
| JP | 2014082735 A | | 5/2014 | |
| JP | 2014511053 A | | 5/2014 | |
| JP | 6268612 B2 | * | 1/2018 | ............. G01B 7/003 |
| WO | WO-2012108254 A1 | * | 8/2012 | ............. H03H 7/463 |
| WO | 2018136256 A1 | | 7/2018 | |

OTHER PUBLICATIONS

ZTE Corporation, International Search Report, PCT/CN2020/093857, Aug. 27, 2020, 6 pgs.
ZTE Corporation, CN First Office Action with English Translation, CN201910630690.1, Feb. 20, 2021, 13 pgs.

\* cited by examiner

DEVICE FOR DETECTING SAR, METHOD FOR REDUCING SAR, AND MOBILE TERMINAL

CROSS REFERENCE TO RELATED APPLICATIONS

This present application is a United States National Stage Application filed under 35 U.S.C. § 371 of PCT Patent Application No. PCT/CN2020/093857, filed Jun. 2, 2020, which claims the benefit of priority to Chinese patent application No. 201910630690.1, filed on Jul. 12, 2019, each of which is incorporated by reference herein in its entirety.

TECHNICAL FIELD

The present disclosure relates to the field of antenna technology, in particular, to a device for detecting SAR, a method for reducing SAR, and a mobile terminal.

BACKGROUND 2G, 3G, and 4G networks coexist currently after years of development of mobile terminals. With development of the $5^{th}$-generation (5G) communication technology, the number of antennas will further increase, and a problem of specific absorption rate (SAR) will increase.

Take mobile phone as an example of the mobile terminals discussed herein, while development of the 5G communication is accelerating, there would be more and more antennas in a mobile phone operate simultaneously for emitting electromagnetic energy, such as main antenna, WiFi antenna and multiple-input multiple-output (MIMO) antenna. Consequently, tissues and organs of the human body are exposed more to electromagnetic radiation.

SUMMARY

The present disclosure provides a device for detecting specific absorption rate (SAR), a method for reducing SAR and a mobile terminal. Herein, detection on SARs of multiple antennas in the mobile terminal may be performed through an SAR sensor.

An embodiment of the present disclosure provides a device for detecting SAR including: an SAR sensor 1, a plurality of first capacitance limitation modules 2, a plurality of second capacitance limitation modules 3, and a plurality of signal isolation modules 4.

The SAR sensor 1 includes a plurality of detection ports 11, and each of the detection ports 11 is configured to perform SAR detection on one of antennas 5.

A first end of each of the first capacitance limitation modules 2 is connected to one of the antennas 5, a second end of each of the first capacitance limitation modules 2 is connected to one of the detection ports 11, and the first capacitance limitation modules 2 are configured to limit a capacitance value on an antenna 5 side.

A first end of each of the second capacitance limitation modules 3 is connected to one of the detection ports 11, a second end of each of the second capacitance limitation modules 3 is connected to one of power control circuits 6, and the second capacitance limitation module 3 is configured to limit a capacitance value on a power control circuit 6 side.

A first end of each of the signal isolation modules 4 is connected to one of the antennas 5, a second end of each of the signal isolation modules 4 is connected to one of the detection ports 11, and each of the signal isolation module 4 is configured to isolate radio frequency signals on a radio frequency path between the one of antennas 5 and the power control circuit 6 and to transmit SAR signals of the antenna 5.

An embodiment of the present disclosure further provides a method for reducing specific absorption rate SAR, including obtaining separately SAR signals of a plurality of antennas through a plurality of detection channels of an SAR sensor; determining closeness of a human body to an antenna corresponding to a detection channel according to an SAR signal obtained by each detection channel; and reducing a transmission power of the antenna in a case where the closeness of the human body to the antenna is less than or equal to a safe distance.

An embodiment of the present disclosure further provides a mobile terminal including the device for detecting SAR as described in the above.

REFERENCE SIGNS

1—SAR sensor;
2—first capacitance limitation module;
3—second capacitance limitation module;
4—signal isolation module;
5—antenna;
6—power control circuit;
7—radio frequency cable;
8—antenna matching circuit;
11—detection port of the SAR sensor;
21—first capacitance limitation module for a first antenna;
22—first capacitance limitation module for a second antenna;
31—second capacitance limitation module for the first antenna;
32—second capacitance limitation module for the second antenna;
41—signal isolation module for the first antenna;
42—signal isolation module for the second antenna;
51—first antenna;
52—second antenna;
61—first power control circuit;
62—second power control circuit;
81—first antenna matching circuit;
82—second antenna matching circuit;
101—first circuit board;

102—second circuit board;
111—first detection port of the SAR sensor;
112—second detection port of the SAR sensor.

DETAILED DESCRIPTION

Embodiments of the present disclosure are described with reference to the drawings as follows.

In the present disclosure, a plurality of embodiments are described for illustrating rather than limiting. There may be more embodiments and solutions within a scope of the embodiments described in the present disclosure. Although some possible combinations of characteristics are shown in the drawings and discussed in the embodiments, other combinations of the characteristics disclosed herein may also be possible. Except for a case where limitation is specified, any characteristic or element of any embodiment may be combined with or replaced with any other characteristic or element in any other embodiment.

The embodiments, characteristics and elements disclosed in the present disclosure may be combined with conventional characteristics or elements to form the solutions of the present disclosure. Any characteristic or element of any of the embodiments may be combined with a characteristic or element in another technical solution. Any feature shown and/or discussed in the present disclosure may be implemented individually or in any appropriate combination.

SAR sensors emerge for protection of human health. An SAR sensor may automatically detect whether there is a human body approaching an antenna within a certain range of distances from the antenna. A human body is a semiconductor. When the human body is approaching an antenna (metal), a capacitance value sensed by the antenna changes. A chip of the SAR sensor detects the closeness of the human body to the antenna by detecting capacitance changes of the antenna.

Embodiment One

Figure 1:
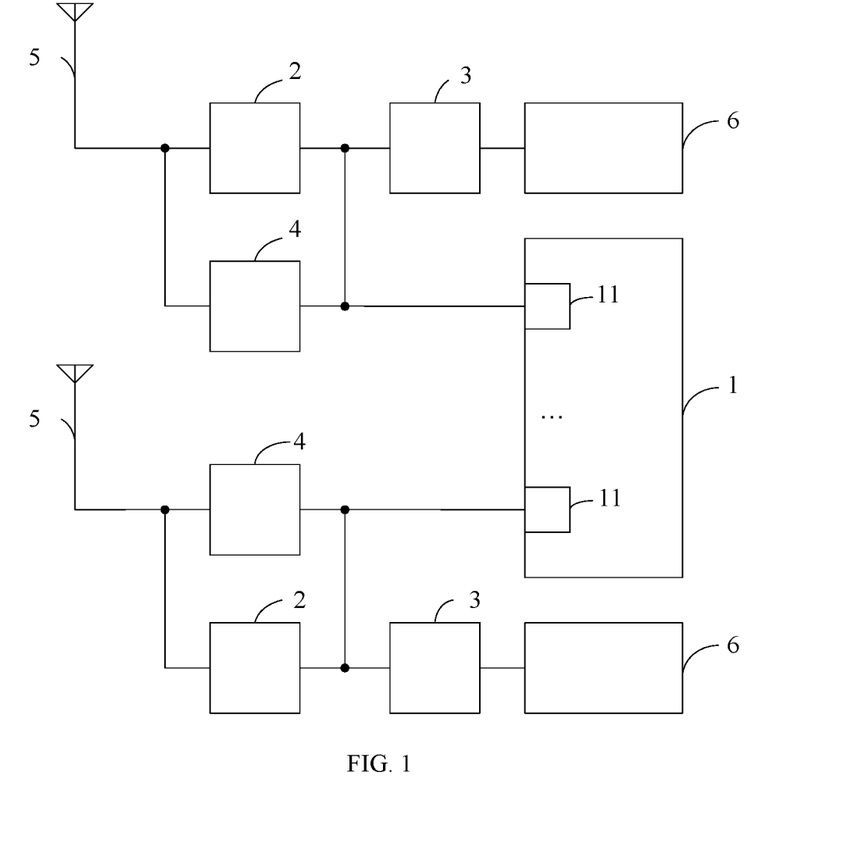
FIG. 1 is a schematic diagram showing a device for detecting SAR according to Embodiment one.

As shown in FIG. 1, an embodiment of the present disclosure provides a device for detecting a specific absorption rate SAR, including: a SAR sensor 1, a plurality of first capacitance limitation modules 2, a plurality of second capacitance limitation modules 3, and a plurality of signal isolation modules 4. Herein, the SAR sensor 1 includes a plurality of detection ports 11, and each of the detection port 11 is configured to perform SAR detection on one of the antennas 5. A first end of each of the first capacitance limitation module 2 is connected to one of the antennas 5; a second end of the first capacitance limitation module 2 is connected to one of the detection ports 11. The first capacitance limitation module 2 is configured to limit a capacitance value on an antenna 5 side. A first end of a second capacitance limitation modules 3 is connected to one of the detection ports 11, a second end of the second capacitance limitation module 3 is connected to a power control circuit 6, and the second capacitance limitation module 3 is configured to limit a capacitance value on a power control circuit 6 side. A first end of each of the signal isolation modules 4 is connected to one of the antennas 5, a second end of the signal isolation modules 4 is connected to one of the detection ports 11, and the signal isolation module 4 is configured to isolate radio frequency signals on a radio frequency path between the antenna 5 and the power control circuit 6 and to transmit SAR signals of the antenna 5.

Figure 2:
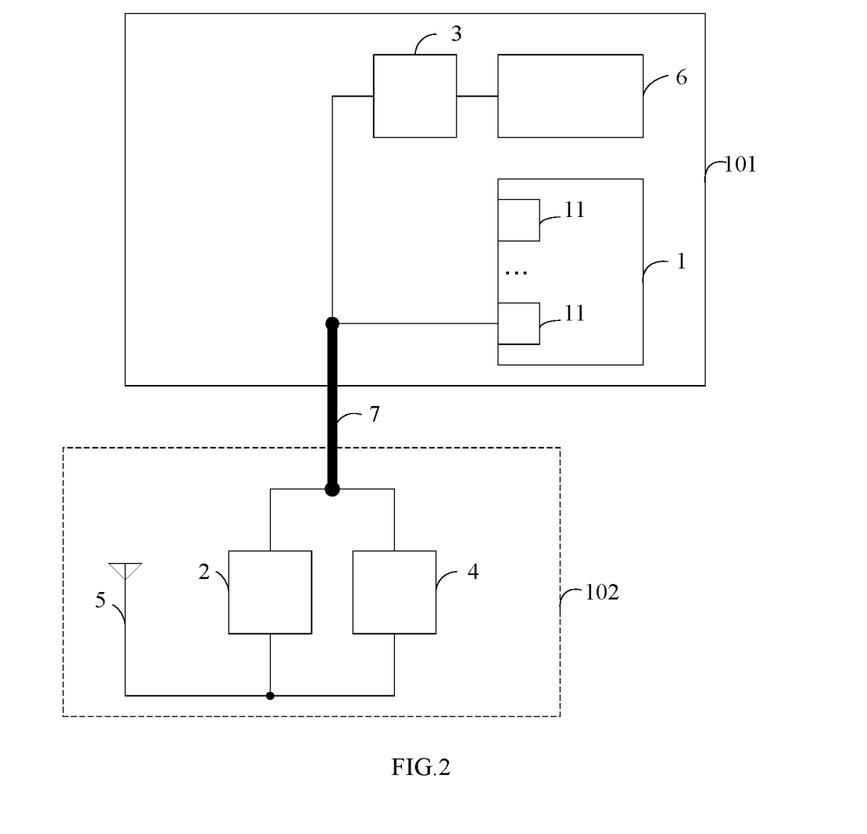
FIG. 2 is a schematic diagram showing a radio frequency path including a radio frequency cable according to Embodiment one.

In one implementation, as shown in FIG. 2, in a case where the antenna 5 and the SAR sensor 1 are not on a same circuit board, the radio frequency path between the antenna 5 and the power control circuit 6 includes a radio frequency cable 7 connecting two circuit boards. A first end of the radio frequency cable 7 is configured to be separately connected to a second end of a first capacitance limitation module 2 and a second end of a signal isolation module 4, and a second end of the radio frequency cable 7 is configured to be connected to the detection port 11. Herein, the SAR sensor 1 and the power control circuit 6 are provided on a first circuit board 101, and the antenna 5 is provided on a second circuit board 102.

In one implementation, the first circuit board 101 is a main board, while the second circuit board 102 is a sub-board; or the first circuit board 101 is the sub-board, while the second circuit board 102 is the main board.

In the above implementation, SAR detection of an antenna not on the same circuit board as the SAR sensor may be performed by using a radio frequency cable between two circuit boards. In this way, one SAR sensor chip may synchronously perform SAR detection on multiple antennas.

In one implementation, the radio frequency path between the antenna 5 and the power control circuit 6 includes an antenna matching circuit 8, the antenna matching circuit 8 includes a resistor, a capacitor and an inducer, and is configured to perform impedance matching on the antenna 5. There may be various forms of the antenna matching circuit 8, and the circuit is well known in the art.

Figure 3:
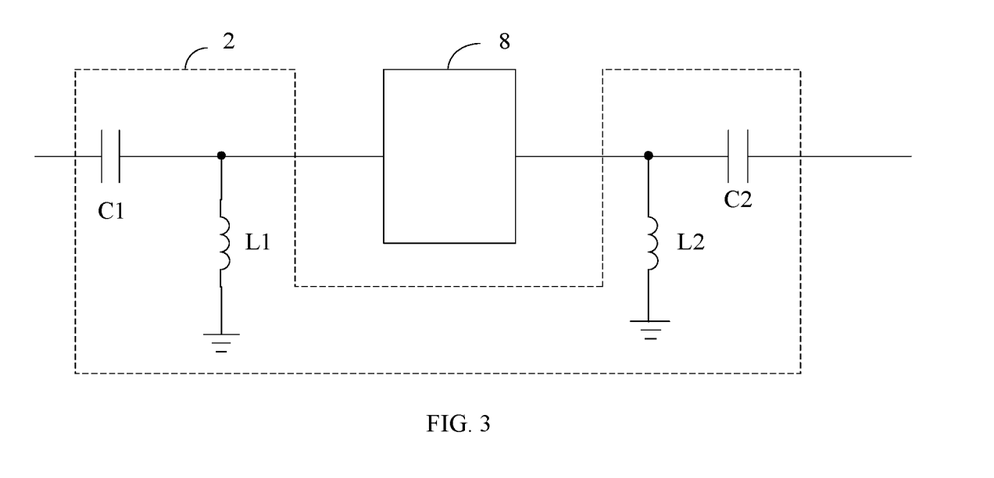
FIG. 3 is a schematic diagram showing a first capacitance limitation module according to Embodiment one.

As shown in FIG. 3, the radio frequency path between the antenna 5 and the power control circuit 6 includes the antenna matching circuit 8 configured to perform impedance matching on the antenna 5.

The first capacitance limitation module 2 includes: a first capacitor C1, a second capacitor C2, a first inducer L1 and a second inducer L2; a first end of the first capacitor C1 is taken as a first end of the first capacitance limitation module 2, a second end of the first capacitor C1 is connected to a first end of the first inducer L1 and a first end of the antenna matching circuit 8 respectively, and a second end of the first inducer L1 is grounded; a first end of the second capacitor C2 is separately connected to a second end of the antenna matching circuit 8 and a first end of the second inducer L2, and a second end of the second inducer L2 is grounded; and a second end of the second capacitor C2 is taken as a second end of the first capacitance limitation module 2.

Figure 4:
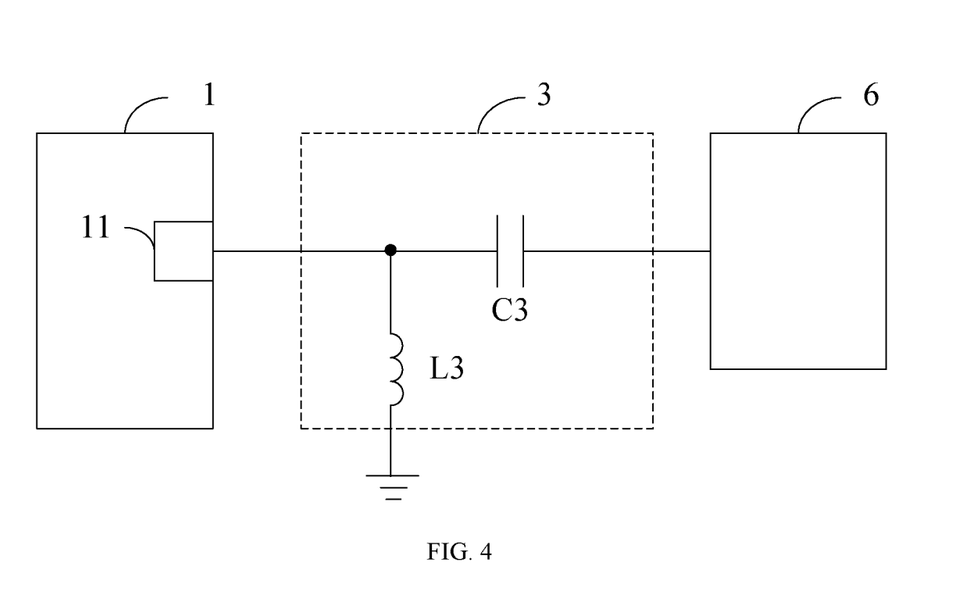
FIG. 4 is a schematic diagram showing a second capacitance limitation module according to Embodiment one.

In one implementation, as shown in FIG. 4, a second capacitance limitation module 3 includes a third capacitor C3 and a third inducer L3; a first end of the third capacitor C3 is taken as a first end of the second capacitance limitation module 3, a second end of the third capacitor C3 is taken as a second end of the second capacitance limitation module 3; and a first end of the third inducer L3 is connected to the first end of the third capacitor C3, and a second end of the third inducer L3 is grounded. Herein, the first capacitance limitation module 2 may make a capacitance value detected at an antenna 5 side by the detection port 11 of the SAR sensor not change with capacitance of the antenna matching circuit 8, thereby a big capacitance of the antenna matching circuit 8 will not affect the detection port 11 of the SAR sensor.

The second capacitance limitation module 3 may make a capacitance value detected at a power control circuit 6 side by the detection port 11 of the SAR sensor not change with capacitance of the power control circuit 6, thereby a big capacitance of the power control circuit 6 will not affect the detection port 11 of the SAR sensor.

Figure 5:
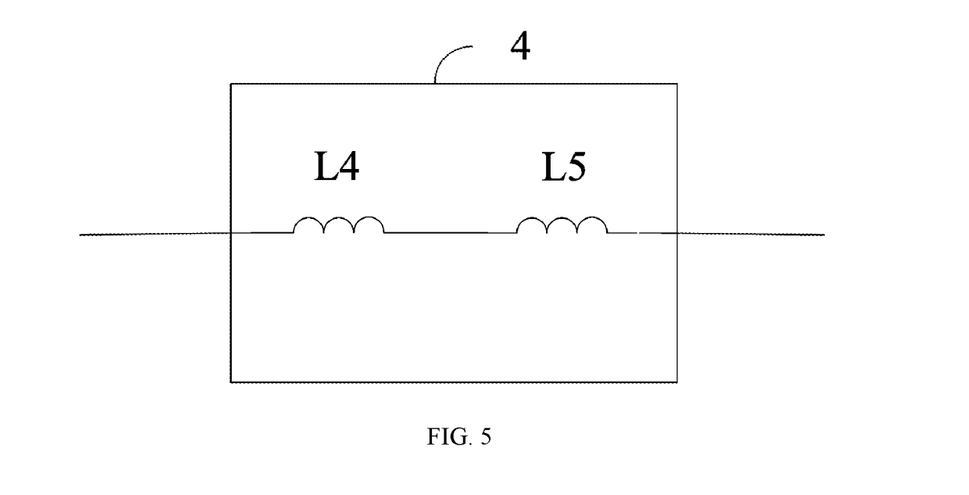
FIG. 5 is a schematic diagram showing a signal isolation module according to Embodiment one.

In one implementation, as shown in FIG. 5, the signal isolation module 4 includes an inducer L4 and an inducer L5; and a first end of the inducer L4 is taken as a first end of the signal isolation module 4, a second end of the inducer L4 is connected to a first end of the inducer L5, and a second end of the inducer L5 is taken as a second end of the signal isolation module 4. Herein, frequency of the SAR detecting signals is low, for example, from dozens to hundreds of KHzs. However, frequency of communication signals on a radio frequency path between an antenna and an antenna signal transceiver module is usually as much as hundreds of MHz to several GHz, and power thereof is large. By setting the signal isolation module 4 before the detection port 11 of the SAR sensor, high-frequency communication signals on the antenna may be prevented from affecting SAR detection through blocking of inductance on the high-frequency communication signals, and SAR signals on the antenna 5 may be transmitted.

Compared with existing technologies, the device for detecting SAR according to the embodiment of the present disclosure uses multiple channels of an SAR sensor to perform SAR detection on multiple antennas, and uses a signal isolation module so that the radio frequency signals between an antenna and a power control circuit will not affect a detection port of the SAR sensor and a big capacitance will not affect the SAR detection.

Embodiment Two

Figure 6:
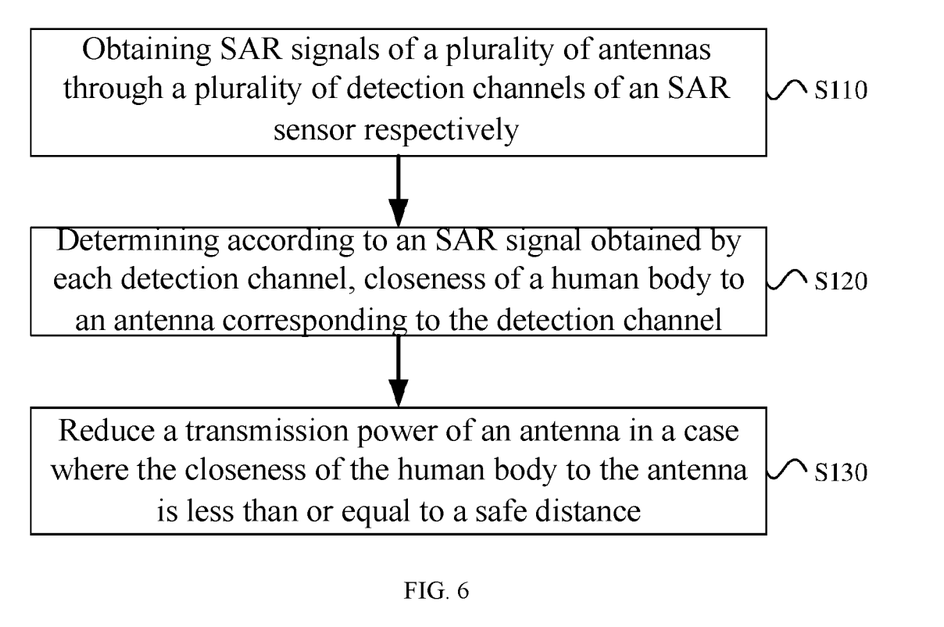
FIG. 6 is a flow chart showing a method for reducing SAR according to Embodiment two.

As shown in FIG. 6, an embodiment of the present disclosure provides a method for reducing a specific absorption rate SAR, including following steps: at step S110: SAR signals of a plurality of antennas are obtained respectively through a plurality of detection channels of an SAR sensor; at step S120: closeness of a human body to an antenna corresponding to the each detection channel is determined according to an SAR signal obtained through each detection channel; and at step S130: a transmission power of an antenna is reduced if the closeness of the human body to the antenna is less than or equal to a safe distance.

In the above implementations, a mobile terminal may be held by a user with various gestures. In some scenarios, one antenna in the mobile terminal may be close to the user so that the SAR is excessively high, while other antennas are distant from the user and SARs of these antennas are not excessively high. With one SAR sensor synchronously detecting SAR signals of multiple antennas and then processing SAR signals of each antenna respectively, reducing SARs of each antenna may be independently. Therefore, the solution for reducing SAR is more flexible and hardware cost thereof is reduced.

Embodiment Three

An embodiment of the present disclosure provides a mobile terminal including the device for detecting SAR according to Embodiment one.

The technical solution of detecting SAR in the present disclosure is described with the following examples.

Example 1

Figure 7:
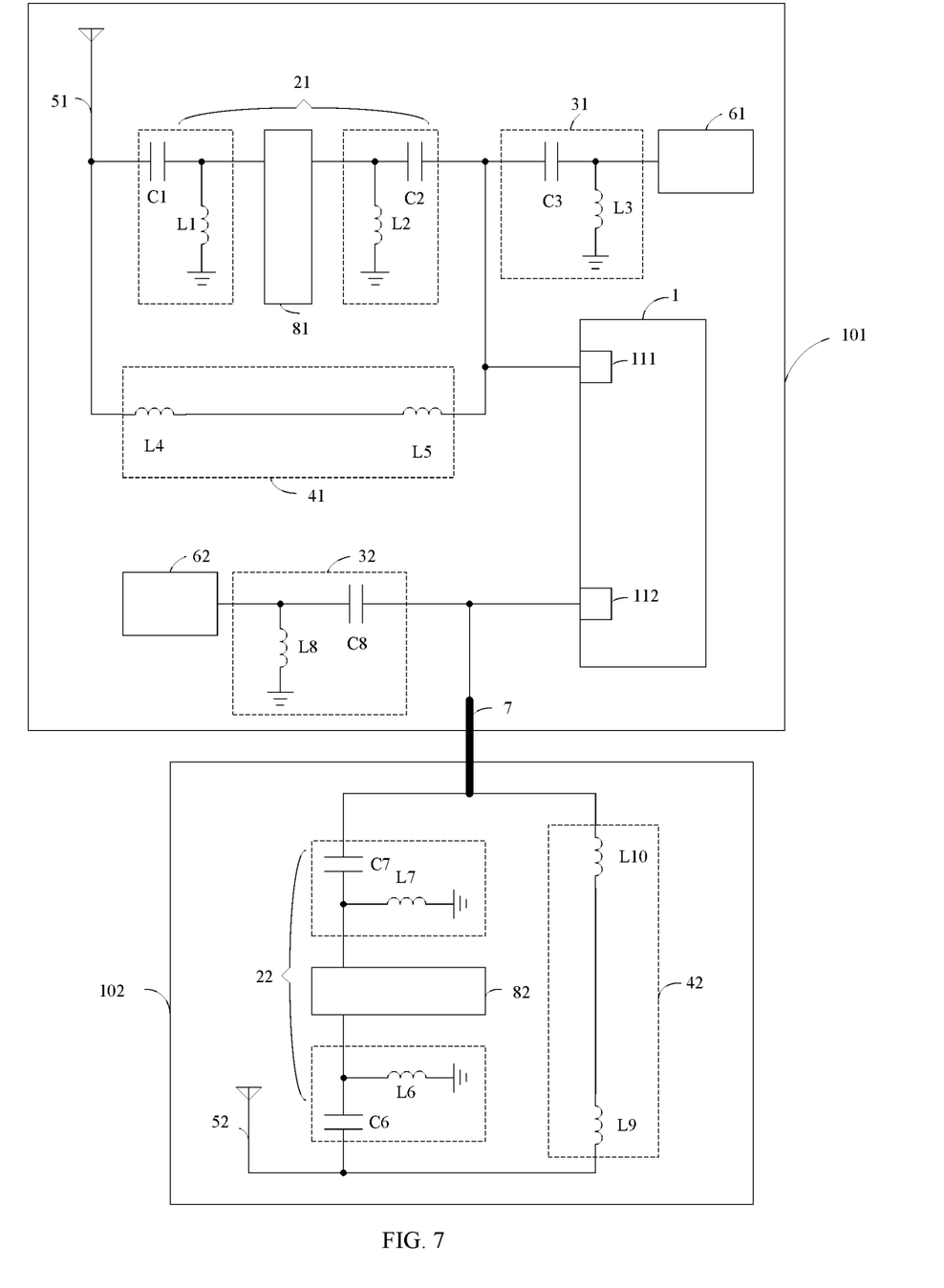
FIG. 7 is a schematic diagram showing an apparatus for reducing SAR on a mobile terminal according to Embodiment one.

As shown in FIG. 7, this example provides a device for detecting SAR in a mobile terminal. The mobile terminal includes: a first circuit board (main board) 101; a second circuit board (sub-board) 102; a first antenna (WiFi antenna) 51, a first power control circuit 61, a second power control circuit 62 and a device for detecting SAR, provided on the main board 101; and a second antenna (main antenna) 52 provided on the sub-board 102.

The device for detecting SAR includes an SAR sensor 1, a first capacitance limitation module 21 for the first antenna, a second capacitance limitation module 31 for the first antenna, a signal isolation module 41 for the first antenna, a first capacitance limitation module 22 for the second antenna, a second capacitance limitation module 32 for the second antenna and a signal isolation module 42 for the second antenna.

The SAR sensor 1 includes a first detection port 111 and a second detection port 112. The first detection port 111 is configured to perform SAR detection on the first antenna 51, and the second detection port 112 is configured to perform SAR detection on the second antenna 52.

A radio frequency path between the first antenna 51 and the first power control circuit 61 includes a first antenna matching circuit 81. A radio frequency path between the second antenna 52 and the second power control circuit 62 includes a second antenna matching circuit 82. Each of the first antenna matching circuit 81 and the second antenna matching circuit 82 includes a resistor, a capacitor and an inducer and is configured to perform impedance matching on the antenna. There may be various forms of the circuits which is commonly known in the art.

The first capacitance limitation module 21 for the first antenna includes a first capacitor C1, a second capacitor C2, a first inducer L1 and a second inducer L2. A first end of the first capacitor C1 is taken as a first end of the first capacitance limitation module 21 for the first antenna and is connected to the first antenna 51. A second end of the first capacitor C1 is connected to a first end of the first inducer L1 and a first end of the first antenna matching circuit 81 respectively. A second end of the first inducer L1 is grounded. A first end of the second capacitor C2 is connected to a second end of the first antenna matching circuit 81 and a first end of the second inducer L2 respectively. A second end of the second inducer L2 is grounded. A second end of the second capacitor C2 is taken as a second end of the first capacitance limitation module 21 for the first antenna and is connected to the first detection port 111.

The second capacitance limitation module 31 for the first antenna includes a third capacitor C3 and a third inducer L3. A first end of the third capacitor C3 is taken as a first end of the second capacitance limitation module 31 for the first antenna and is connected to the first detection port 111. A second end of the third capacitor C3 is taken as a second end of the second capacitance limitation module 31 for the first antenna and is connected to the first power control circuit 61. A first end of the third inducer L3 is connected to the first end of the third capacitor C3, and a second end of the third inducer L3 is grounded.

The signal isolation module 41 for the first antenna includes an inducer L4 and an inducer L5. A first end of the inducer L4 is taken as a first end of the signal isolation module 41 for the first antenna and is connected to the first antenna 51. A second end of the inducer L4 is connected to a first end of the inducer L5. A second end of the inducer L5 is taken as a second end of the signal isolation module 41 for the first antenna and is connected to the first detection port 111. The signal isolation module 41 for the first antenna is configured to isolate radio frequency signals on the radio frequency path between the first antenna 51 and the first power control circuit 61, and to transmit SAR signals of the first antenna 51.

The second antenna 52 is provided on the sub-board 102. Both the SAR sensor 1 and the second power control circuit 62 are provided on the main board 101. Therefore, the radio frequency path between the second antenna 52 and the second power control circuit 62 further includes a radio frequency cable 7 connecting across two circuit boards. A first end of the radio frequency cable 7 is configured to be connected to a second end of the first capacitance limitation module 22 for the second antenna and a second end of the signal isolation module 42 for the second antenna respectively. The second end of the radio frequency cable 7 is configured to be connected to the second detection port 112.

The first capacitance limitation module 22 for the second antenna includes a capacitor C6, a capacitor C7, an inducer L6 and an inducer L7. A first end of the capacitor C6 is taken as a first end of the first capacitance limitation module 22 for the second antenna and is connected to the second antenna 52. A second end of the capacitor C6 is respectively connected to a first end of the inducer L6 and a first end of the second antenna matching circuit 82. A second end of the inducer L6 is grounded. A first end of the capacitor C7 is connected to a second end of the second antenna matching circuit 82 and a first end of the inducer L7 respectively. A second end of the inducer L7 is grounded. A second end of the capacitor C7 is taken as a second end of the first capacitance limitation module 22 for the second antenna and is connected to the first end of the radio frequency cable 7. The second end of the radio frequency cable 7 is connected to the second detection port 112.

The second capacitance limitation module 32 for the second antenna includes a capacitor C8 and an inducer L8. A first end of the capacitor C8 is taken as a first end of the second capacitance limitation module 32 for the second antenna and is connected to the second detection port 112. A second end of the capacitor C8 is taken as a second end of the second capacitance limitation module 32 for the second antenna and is connected to the second power control circuit 62. A first end of the inducer L8 is connected to the first end of the capacitor C8, and a second end of the inducer L8 is grounded.

The signal isolation module 42 for the second antenna includes an inducer L9 and an inducer L10. A first end of the inducer L9 is taken as a first end of the signal isolation module 42 for the second antenna and is connected to the second antenna 52. A second end of the inducer L9 is connected to a first end of the inducer L10. A second end of the inducer L10 is taken as a second end of the signal isolation module 42 for the second antenna and is connected to the first end of the radio frequency cable 7. The second end of the radio frequency cable 7 is connected to the second detection port 112. The signal isolation module 42 for the second antenna is configured to isolate radio frequency signals on the radio frequency path between the second antenna 52 and the second power control circuit 62, and to transmit SAR signals of the second antenna 52.

The mobile terminal obtains SAR signals of the first antenna through the first detection channel of the SAR sensor, obtains SAR signals of the second antenna through the second detection channel of the SAR sensor, determines whether a distance between the human body and the first antenna is smaller than or equal to a safe threshold according to the SAR signals of the first antenna, and determines whether a distance between the human body and the second antenna is smaller than or equal to the safe threshold according to the SAR signals of the second antenna. When the distance between the human body and the first antenna is smaller than or equal to the safe threshold, the transmission power of the first antenna is reduced. When the distance between the human body and the second antenna is smaller than or equal to the safe threshold, the transmission power of the second antenna is reduced.

In the above example, the mobile terminal transmits SAR signals of the antenna (main antenna) distant from the detection port of the SAR sensor through a radio frequency cable available between the main board and the sub-board. In this way, in a case where the cost of SAR devices or area for distribution of the devices is not increased, one SAR sensor chip may synchronously detect SAR signals of an antenna (WiFi antenna) close to the SAR sensor and SAR signals of an antenna (main antenna) far away from the SAR sensor. With one SAR sensor synchronously detecting SAR signals of two antennas, the mobile terminal separately processes SAR signals of each antenna, and control of reducing SARs of each antenna independently may be achieved. Therefore, a solution of reducing SAR is more flexible and hardware cost thereof is reduced.

What is claimed is:

1. A device for detecting specific absorption rate (SAR) in a mobile terminal, the mobile terminal comprising a first circuit board and a second circuit board and a radio frequency cable connecting across the first circuit board and the second circuit board and the device comprising: a SAR sensor, a first capacitance limitation module for a first antenna, a second capacitance limitation module for the first antenna, a signal isolation module for the first antenna, a first capacitance limitation module for a second antenna, a second capacitance limitation module for the second antenna and a signal isolation module for the second antenna; wherein, the SAR sensor comprises a first detection port and a second detection port, the first detection port is configured to perform SAR detection on the first antenna, and the second detection port is configured to perform SAR detection on the second antenna;

the first capacitance limitation module for the first antenna comprises a first capacitor C1, a second capacitor C2, a first inducer L1 and a second inducer L2, a first end of the first capacitor C1 is connected to the first antenna, a second end of the first capacitor C1 is connected to a first end of the first inducer L1 and a first end of a first antenna matching circuit, a second end of the first inducer L1 is grounded; a first end of the second capacitor C2 is connected to a second end of the first antenna matching circuit and a first end of the second inducer L2, a second end of the second inducer L2 is grounded, a second end of the second capacitor C2 is connected to the first detection port; wherein the first antenna matching circuit is located on a radio frequency path between the first antenna and a first power control circuit and is configured to perform impedance matching on the first antenna, and the first capacitance limitation module for the first antenna is configured to make a capacitance value detected at a first antenna side by the first detection port not change with capacitance of the first antenna matching circuit;

the second capacitance limitation module for the first antenna comprises a third capacitor C3 and a third inducer L3, a first end of the third capacitor C3 is connected to the first detection port, a second end of the third capacitor C3 is connected to the first power control circuit and a first end of the third inducer L3, a second end of the third inducer L3 is grounded, and the second capacitance limitation module for the first antenna is configured to make a capacitance value detected at a first power control circuit side by the first detection port not change with capacitance of the first power control circuit;

the signal isolation module for the first antenna comprises an a fourth inducer L4 and a fifth inducer L5, a first end of the fourth inducer L4 is connected to the first antenna, a second end of the fourth inducer L4 is connected to a first end of the fifth inducer L5, a second end of the fifth inducer L5 is connected to the first detection port, and the signal isolation module for the first antenna is configured to isolate a radio frequency signal on a radio frequency path between the first antenna and the first power control circuit and to transmit a SAR signal of the first antenna;

the first capacitance limitation module for the second antenna comprises a fourth capacitor C6, a fifth capacitor C7, a sixth inducer L6 and a seventh inducer L7, a first end of the fourth capacitor C6 is connected to the second antenna, a second end of the fourth capacitor C6 is connected to a first end of the sixth inducer L6 and a first end of a second antenna matching circuit, a second end of the sixth inducer L6 is grounded; a first end of the fifth capacitor C7 is connected to a second end of the second antenna matching circuit and a first end of the seventh inducer L7, a second end of the seventh inducer L7 is grounded, a second end of the fifth capacitor C7 is connected to the second detection port; wherein the second antenna matching circuit is located on a radio frequency path between the second antenna and a second power control circuit and is configured to perform impedance matching on the second antenna, and the first capacitance limitation module for the second antenna is configured to make a capacitance value detected at a second antenna side by the second detection port not change with capacitance of the second antenna matching circuit;

the second capacitance limitation module for the second antenna comprises a sixth capacitor C8 and a eighth inducer L8, a first end of the sixth capacitor C8 is connected to the second detection port, a second end of the sixth capacitor C8 is connected to the second power control circuit and a first end of the eighth inducer L8, a second end of the eighth inducer L8 is grounded, and the second capacitance limitation module for the second antenna is configured to make a capacitance value detected at a second power control circuit side by the second detection port not change with capacitance of the second power control circuit;

the signal isolation module for the second antenna comprises an a ninth inducer L9 and a tenth inducer L10, a first end of the ninth inducer L9 is connected to the second antenna, a second end of the ninth inducer L9 is connected to a first end of the tenth inducer L10, a second end of the tenth inducer L10 is connected to the second detection port, and the signal isolation module for the second antenna is configured to isolate a radio frequency signal on a radio frequency path between the second antenna and the second power control circuit and to transmit a SAR signal of the second antenna;

the SAR sensor, the first antenna, the first capacitance limitation module for the first antenna, the second capacitance limitation module for the first antenna, the signal isolation module for the first antenna, the first power control circuit, the second capacitance limitation module for the second antenna and the second power control circuit are on the first circuit board; the second antenna, the first capacitance limitation module for the second antenna and the signal isolation module for the second antenna are on the second circuit board; and the radio frequency cable is located on the radio frequency path between the second antenna and the second power control circuit, a first end of the radio frequency cable is configured to be connected to the second end of the fifth capacitor C7 and the second end of the tenth inducer L10, and a second end of the radio frequency cable is configured to be connected to the second detection port and the first end of the sixth capacitor C8.

2. The device according to claim 1, wherein, the first circuit board is main board, the second circuit board is sub-board, the first antenna is WiFi antenna and the second antenna is main antenna.

3. A mobile terminal, comprising: a first circuit board, a second circuit board, a radio frequency cable connecting across the first circuit board and the second circuit board, a first antenna, a second antenna, a first power control circuit, a second power control circuit and a device for detecting specific absorption rate (SAR); wherein, the device for detecting SAR comprises: a SAR sensor, a first capacitance limitation module for the first antenna, a second capacitance limitation module for the first antenna, a signal isolation module for the first antenna, a first capacitance limitation module for the second antenna, a second capacitance limitation module for the second antenna and a signal isolation module for the second antenna; wherein, the SAR sensor comprises a first detection port and a second detection port, the first detection port is configured to perform SAR detection on the first antenna, and the second detection port is configured to perform SAR detection on the second antenna;

the first capacitance limitation module for the first antenna comprises a first capacitor C1, a second capacitor C2, a first inducer L1 and a second inducer L2, a first end of the first capacitor C1 is connected to the first antenna, a second end of the first capacitor C1 is connected to a first end of the first inducer L1 and a first end of a first antenna matching circuit, a second end of the first inducer L1 is grounded; a first end of the second capacitor C2 is connected to a second end of the first antenna matching circuit and a first end of the second inducer L2, a second end of the second inducer L2 is grounded, a second end of the second capacitor C2 is connected to the first detection port; wherein the first antenna matching circuit is located on a radio frequency path between the first antenna and a first power control circuit and is configured to perform impedance matching on the first antenna, and the first capacitance limitation module for the first antenna is configured to make a capacitance value detected at a first antenna side by the first detection port not change with capacitance of the first antenna matching circuit;

the second capacitance limitation module for the first antenna comprises a third capacitor C3 and a third inducer L3, a first end of the third capacitor C3 is connected to the first detection port, a second end of the third capacitor C3 is connected to the first power control circuit and a first end of the third inducer L3, a second end of the third inducer L3 is grounded, and the second capacitance limitation module for the first antenna is configured to make a capacitance value detected at a first power control circuit side by the first detection port not change with capacitance of the first power control circuit;

the signal isolation module for the first antenna comprises an a fourth inducer L4 and a fifth inducer L5, a first end of the fourth inducer L4 is connected to the first antenna, a second end of the fourth inducer L4 is connected to a first end of the fifth inducer L5, a second end of the fifth inducer L5 is connected to the first detection port, and the signal isolation module for the first antenna is configured to isolate a radio frequency signal on a radio frequency path between the first antenna and the first power control circuit and to transmit a SAR signal of the first antenna;

the first capacitance limitation module for the second antenna comprises a fourth capacitor C6, a fifth capacitor C7, a sixth inducer L6 and a seventh inducer L7, a first end of the fourth capacitor C6 is connected to the second antenna, a second end of the fourth capacitor C6 is connected to a first end of the sixth inducer L6 and a first end of a second antenna matching circuit, a second end of the sixth inducer L6 is grounded; a first end of the fifth capacitor C7 is connected to a second end of the second antenna matching circuit and a first end of the seventh inducer L7, a second end of the seventh inducer L7 is grounded, a second end of the fifth capacitor C7 is connected to the second detection port; wherein the second antenna matching circuit is located on a radio frequency path between the second antenna and a second power control circuit and is configured to perform impedance matching on the second antenna, and the first capacitance limitation module for the second antenna is configured to make a capacitance value detected at a second antenna side by the second detection port not change with capacitance of the second antenna matching circuit;

the second capacitance limitation module for the second antenna comprises a sixth capacitor C8 and a eighth inducer L8, a first end of the sixth capacitor C8 is connected to the second detection port, a second end of the sixth capacitor C8 is connected to the second power control circuit and a first end of the eighth inducer L8, a second end of the eighth inducer L8 is grounded, and the second capacitance limitation module for the second antenna is configured to make a capacitance value detected at a second power control circuit side by the second detection port not change with capacitance of the second power control circuit;

the signal isolation module for the second antenna comprises an a ninth inducer L9 and a tenth inducer L10, a first end of the ninth inducer L9 is connected to the second antenna, a second end of the ninth inducer L9 is connected to a first end of the tenth inducer L10, a second end of the tenth inducer L10 is connected to the second detection port, and the signal isolation module for the second antenna is configured to isolate a radio frequency signal on a radio frequency path between the second antenna and the second power control circuit and to transmit a SAR signal of the second antenna;

the SAR sensor, the first antenna, the first capacitance limitation module for the first antenna, the second capacitance limitation module for the first antenna, the signal isolation module for the first antenna, the first power control circuit, the second capacitance limitation module for the second antenna and the second power control circuit are on the first circuit board, the second antenna, the first capacitance limitation module for the second antenna and the signal isolation module for the second antenna are on the second circuit board; and the radio frequency cable is located on the radio frequency path between the second antenna and the second power control circuit, a first end of the radio frequency cable is configured to be connected to the second end of the fifth capacitor C7 and the second end of the tenth inducer L10, and a second end of the radio frequency cable is configured to be connected to the second detection port and the first end of the sixth capacitor C8.

4. The mobile terminal according to claim 3, wherein, the first circuit board is main board, the second circuit board is sub-board, the first antenna is WiFi antenna and the second antenna is main antenna.

* * * * *